US005505159A

United States Patent [19]
Mochizuki et al.

[11] Patent Number: 5,505,159
[45] Date of Patent: Apr. 9, 1996

[54] EPITAXIAL GROWTH METHOD OF SEMICONDUCTOR CRYSTAL AND MOLECULAR BEAM EPITAXY APPARATUS FOR THE SAME

[75] Inventors: Yuji Mochizuki; Akira Usui; Toshikazu Takada, all of Tokyo, Japan

[73] Assignee: NEC Corporation, Japan

[21] Appl. No.: 341,530

[22] Filed: Nov. 17, 1994

[30]   Foreign Application Priority Data

Nov. 24, 1993  [JP]  Japan .................................. 5-293257

[51] Int. Cl.$^6$ ................................................. C30B 75/16
[52] U.S. Cl. ............................ 117/89; 117/103; 117/108; 117/953
[58] Field of Search ............................ 117/89, 103, 108, 117/953

[56]   References Cited

U.S. PATENT DOCUMENTS

| | | | |
|---|---|---|---|
| 4,808,551 | 2/1989 | Mori et al. ................................. | 117/89 |
| 4,845,049 | 7/1989 | Sunakawa ................................. | 117/89 |
| 5,025,751 | 6/1991 | Takatani et al. .......................... | 117/103 |
| 5,082,798 | 1/1992 | Asimoto .................................... | 117/89 |
| 5,270,247 | 12/1993 | Sakuma et al. ............................ | 117/89 |
| 5,360,760 | 11/1994 | Hayashi ..................................... | 117/89 |

OTHER PUBLICATIONS

Cotton, F. A. & Wilkinson, G.; *Inorganic Chemistry:* vol. 1, 2 ed. Baihuukan, 1978.
Dai, D. & Balasubramanian, K.; "Geometries and energies of electronic states . . . " J. of Chemical Physics, Aug. '90.
Polanyi, J. C. & Wong, W. H.; "Location of Energy Barriers," J. of Chemical Physics, Aug. '69.
Arlinghaus, R. T. & Andrews, L.; "Infared spectra of the . . . " J. of Chemical Physics, Nov. '84.
Mochizuki, Y.; Takada, T. & USUI, A.; "Physical Review B", May '93.
Tenner et al; "Molecular beam apparatus to study . . . " Surface Science, vol. 236, 1990, pp. 151–168.
Karlicek et al, "The Effect of $PH_3$ Pyrolysis . . . ", Journal of Electrochemical Society, Feb. 1987. pp. 470–474.
Gruter et al, "Deposition of High Quality GaAs Films . . . ", Journal of Crystal Growth, vol. 94, (1989). pp. 607–612.
Beccard et al, "Growth of semi-insulating InP: . . . ", Journal of Crystal Growth, vol. 121, (1992). pp. 373–380.

*Primary Examiner*—Robert Kunemund
*Attorney, Agent, or Firm*—Hayes, Soloway, Hennessey, Grossman & Hage

[57]   ABSTRACT

In an epitaxial growth of a group III–V compound semiconductor crystal, there is provided a substrate on which group III element halide molecules are adsorbed. A beam of group V element hydride molecules is supplied toward the substrate for reaction of the group V element hydride and the group III element halide. The vibration energy of each of group V element hydride molecules is excited in the beam and the orientation of the group V element hydride molecules is aligned. As a result, the supplied group V atom directly combines with the group III atom.

14 Claims, 5 Drawing Sheets

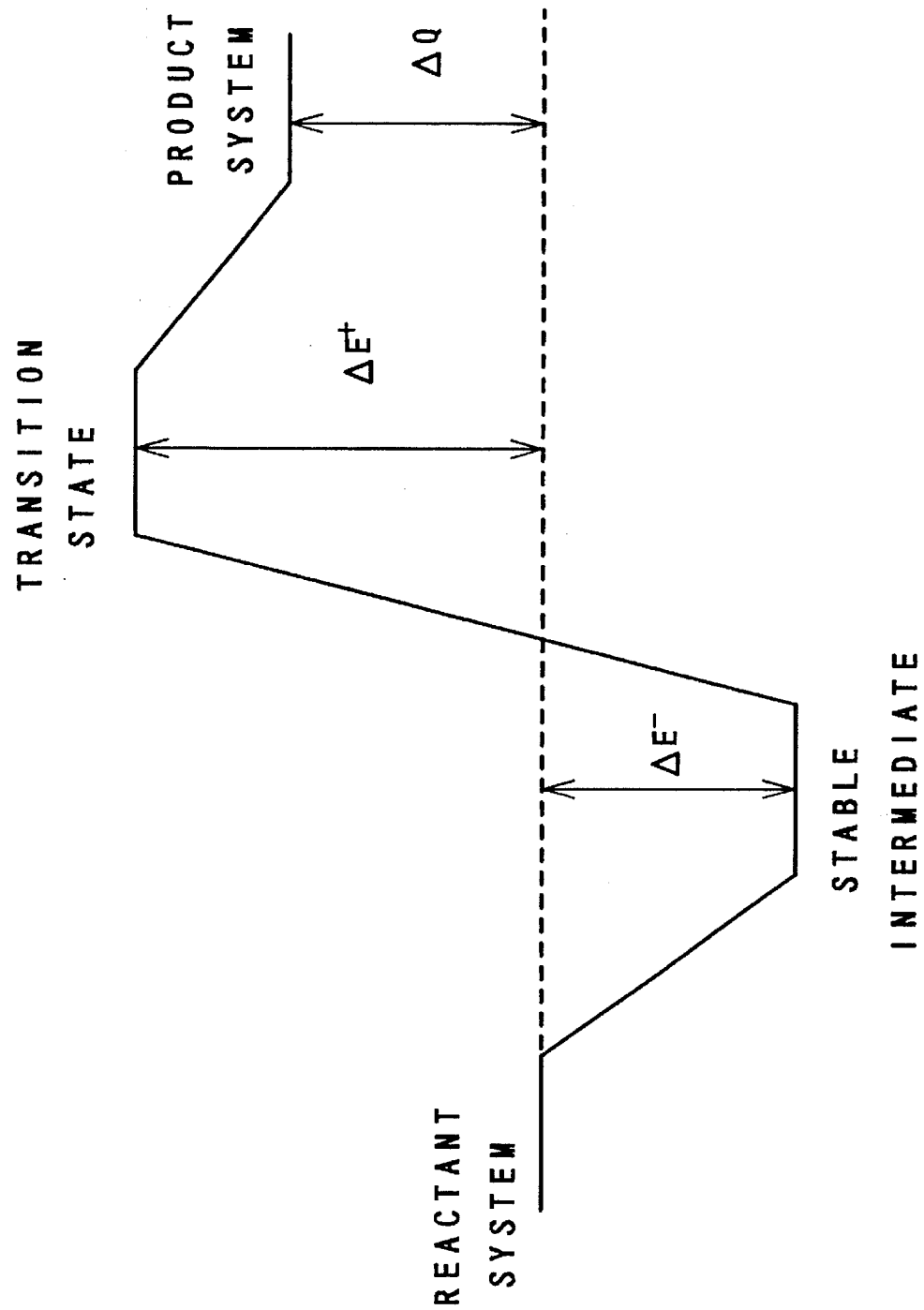

EPITAXIAL GROWTH METHOD OF SEMICONDUCTOR CRYSTAL AND MOLECULAR BEAM EPITAXY APPARATUS FOR THE SAME

BACKGROUND OF THE INVENTION

1. Field of the Invention

The present invention relate to epitaxial growth technique, more particularly, to a method of epitaxially growing a group III–V compound semiconductor crystal using the group V element hydride and the group III element halide and a molecular beam epitaxy apparatus for the same.

2. Description of Related Art

In a conventional chemical vapor deposition (CVD) of the group III–V compound semiconductor such as GaAs using the group III element halide and the group V hydride, species to be grown on the group III elements are the group V element cluster molecules such as $As_4$ and $AsH_2$ produced by decomposing the group V element hydride such as $AsH_3$ under a growth pressure condition. The active surface of the group III elements has been produced by taking halogen atoms out of the group III element halide by use of an $H_2$ gas ambient. In this halogen-removal reaction the activation energy of 40 to 50 kcal/mol is required and the reaction is just a rate-determining step over the whole of growth cycles.

In another CVD the group III element halide such as GaCl and InCl is adsorbed on a substrate in the not-decomposed state by reducing the collision between the group V element hydride molecules under a low pressure or by increasing the flow rate of the molecular beam of the group V element hydride and the group V element hydride is supplied to the surface of the substrate such that the group V element molecules directly combine with the group III element molecules. As a result, the growth rate is higher than a conventional growth rate in the order of $10^3$ to $10^4$ and is not dependent upon the $H_2$ pressure in the reaction ambient. This is reported with respect to $AsH_3$ by Gruter et al. in Journal of Crystal Growth (94, (1989), 607) and with respect to $PH_3$ by Karlicek et al. in Journal of Electrochemical Society (134, (1987), 470) and by Beccard et al. in Journal of Crystal growth (121, (1992), 373). That is, it could be considered in these cases that the reaction of production of hydrogen halide molecules of halogen atoms and hydrogen atoms in the ambient $H_2$ gas and then the reaction of desorption thereof from the substrate do not occur. On the contrary, it could be considered that the group III atom on the surface of the substrate directly combines with the group V atom in the ambient through another reaction path. According to these reports, the growth rate is improved and the film thus obtained is superior in electrical properties such as Hall mobility. However, about 1000 K. is expected as a temperature condition of direct combination reaction between the group V element hydride and the group III element halide. Therefore, there is the demand for a lower temperature condition.

Further, atomic layer epitaxy (to be referred to as "ALE" hereinafter) is well known in the art in which halides are used as the group III medium. In conventional halide ALE, the group V cluster molecules produced with thermal decomposition of the group V element hydride react with the active group III atoms on the substrate surface which are produced by taking halogen atoms out of the substrate surface with $H_2$ in the ambient which is a rate-determining step, so that the growth of the group V atoms on the group III atoms is performed. This reaction processes are similar to the above conventional reactions processes.

The ALE is used to form a quantum wave effect device such as a quantum wire device and a quantum well device which requires the fine structure of a nano-meter scale. If the ALE is used, therefor, it is possible to uniformly grow a film on a fine well or groove structure formed in a substrate. However, in order to avoid the deterioration of the nano-meter scale structure to be produced because diffusion is not desired, the growth temperature should be typically set at 700° C. or below.

Thus, even in the ALE for the halide, it is desirable that the group III atoms are directly combined with the group V atoms to increase the overall growth rate by suppressing the decomposition of molecules of group V element hydride to control the supply to the substrate and by avoiding the removal of halogen atoms by use of $H_2$ gas as the rate determining step, and a film having good electrical properties can be obtained by suppressing the incorporation of impurities into the film and the production of defect. However, in the conventional direct reacting method of the group V element hydride and the group III element halide, the low temperature condition for growth required in the ALE cannot be established.

Further, in the conventional ALE, the selective growth on only a specifically oriented surface plane among adjacent surfaces is difficult.

SUMMARY OF THE INVENTION

The present invention has, as an object, to provide a method of epitaxially growing a group III–V compound semiconductor layer using group III element halide and group V element hydride with a high growth rate.

Another object of the present invention is to provide a method of making a group V atom directly combine with a group III atom on a substrate efficiently at a relatively low temperature.

Still another object of the present invention is to provide a method of epitaxially growing compound semiconductor crystal on a specific surface plane selected from surface planes of the substrate.

Further still another object of the present invention is to provide a molecular beam epitaxy apparatus which can achieve one or more of the above methods.

A method of controlling epitaxial growth a group III –V compound semiconductor crystal according to the present invention, includes the steps of:

providing a substrate on which group III element halide molecules are adsorbed;

supplying a beam of group V element hydride molecules toward the substrate for reaction of the group V element hydride and the group III element halide;

exciting a vibration energy of each of group V element hydride molecules in the beam; and aligning orientation of the group V element hydride molecules in the beam.

A molecular beam epitaxy apparatus according to the present invention, includes a growth reaction chamber in which a substrate is mounted, group III element halide molecules being adsorbed on a surface of the substrate, and a molecular beam gun, whose tip portion is inserted in said chamber, for supplying to said substrate surface a beam of group V element hydride molecules with an excited vibration energy and aligned orientation in a predetermined direction.

A non-empirical molecular orbital calculation was made, taking an $AsH_3/GaCl$ system as an example, to find out the electronic mechanism of an endothermic direct combination reaction of molecules of group III element halide adsorbed on the front-most surface of the substrate and molecules of group V element hydride in the ambient. The present invention is made based on the electronic mechanism thus found. That is, in the present invention, the molecules of group V element hydride is not diffused and supplied simply under the low pressure vapor condition, unlike the conventional technique. In the present invention, as schematically illustrated in FIG. 5, the stretching vibration state of the group V element hydride is excited through the irradiation of infrared beam. The orientations of the molecules are aligned by the gradient of an electric field produced by a multi-pole orientation aligner such as a hexapole electric field such that a lone electron pair of each molecule turns to a direction of the molecular beam, or the substrate for crystal growth. Such molecules are supplied to the group III element halide molecules, which are adsorbed on the front-most surface of the substrate, from an appropriate direction as the aligned molecular beam during the growth. As a result, a epitaxial film can be grown through the direct combination of the group V atom and the group III atom. The film thus obtained has less defects and good quality. The present invention can be applied to the crystal growth such as ALE in which a lower temperature condition is required, compared to the conventional method.

The group V element hydride molecule is in the electronic ground state even if the vibration energy of the molecule is excited. In addition, the collision between the hydride molecules is suppressed in the orientation-aligned molecular beam. Therefore, less radical species such as $AsH_2$ and $AsH$ and group V clusters such as $As_2$ and $As_4$ are produced as the decomposition products. Further, the molecular beam is superior in the cut-off characteristics upon the supply and stop so that the control of supply is easy.

In a case where the uniformity is required in the structure to be grown, it is desirable that the substrate is rotated or turned, or is moved with a constant speed with respect to the nozzle for supplying the molecular beam. When a multi-element crystal containing a plurality of group V elements is to be grown, the group V element hydride molecular beams are supplied from the same molecular beam gun or different guns under adequate timing control.

Since the group III element halide molecule has a lone electron pair and a dipole moment, if the group III element halide molecules are controlled in the orientation and supplied in a form of molecular beam, as well as the group V element hydride molecular beam, it is possible to selectively grow the crystal on only a specific surface plane, e.g., a bottom surface of a groove structure.

If the polarity of the electric field is inverted such that the molecules are turned to a direction opposing the molecular beam direction, it is possible to suppress the growth. If inverting of the polarity of the electric field is applied to the group III element halide molecular beam such that the halogen atom is turned to the beam direction, it is possible to suppress the growth or to enable the substrate to be etched. That is, the present invention can be used as a switch in an atomic level for the growth.

BRIEF DESCRIPTION OF THE DRAWINGS

FIG. 3 is a schematic diagram showing an energy state in the direct combination reaction of the group V element hydride molecule and the group III element halide molecule;

DESCRIPTION OF THE PREFERRED EMBODIMENTS

A molecular beam epitaxy apparatus according to the present invention will be described below with reference to the accompanying drawings, taking as an example the group V– group III compound semiconductor which is produced from group V element hydride molecules and group III element halide molecules.

Figure 1:
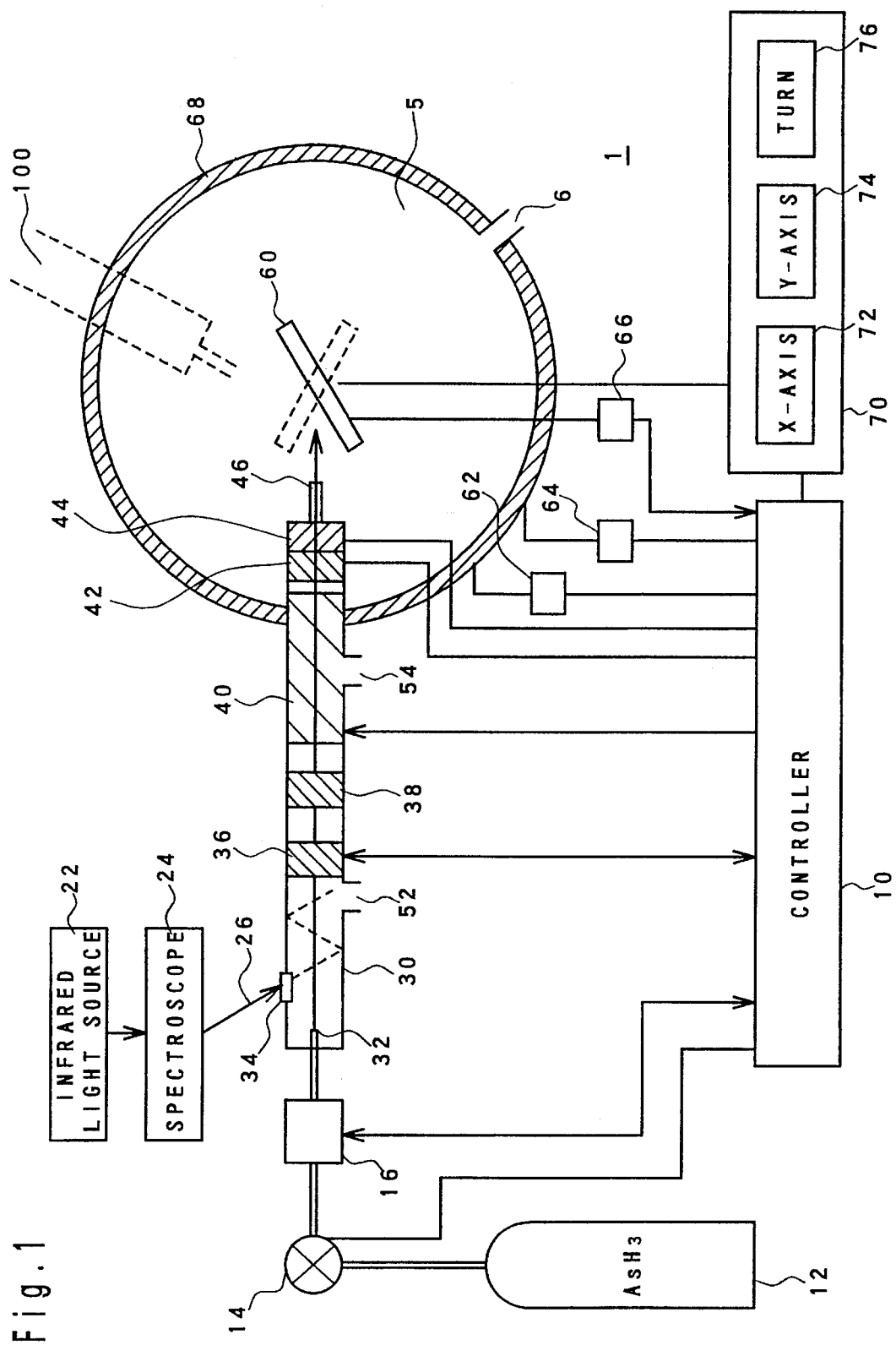
FIG. 1 is a block diagram showing a molecular beam epitaxy apparatus according to an embodiment of the present invention.

FIG. 1 is a block diagram showing the molecular beam epitaxy apparatus 1 according to an embodiment of the present invention. In this embodiment, $AsH_3$ and $GaCl$ are taken as the group V element hydride and the group III halide, respectively. The apparatus 1 is mainly composed of a growth reactor 5, a controller 10 and a molecular beam gun 30.

A cylinder 12 containing $AsH_3$ gas is connected to a pressure regulator 14 which is in turn connected to a flow rate adjuster 16. Both the regulator 14 and the adjuster 16 are controlled by the controller 10. The $AsH_3$ gas regulated in pressure and adjusted in the flow rate is injected into the molecular beam gun 30 from a nozzle 32. Through the regulator 14 and the adjuster 16 the $AsH_3$ molecules are controlled such that they do almost not collide with each other in the beam gun 30.

The apparatus includes an infrared light source 22 such as a dye laser. The beam light from the source 22 is separated in wavelength by a spectroscope 24 and an infrared beam having a predetermined frequency component, i.e., 2140 $cm^{-1}$ or 2150 $cm^{-1}$ is irradiated to a window 34 which is provided in the beam gun 30. The infrared beam is used to excite the beam of group V element hydride molecules in the beam gun 30. The inside wall of the beam gun 30 is polished in mirror manner and the irradiated infrared beam is reflected repeatedly and the molecule beam can be effectively excited with the infrared beam.

Figure 2B:
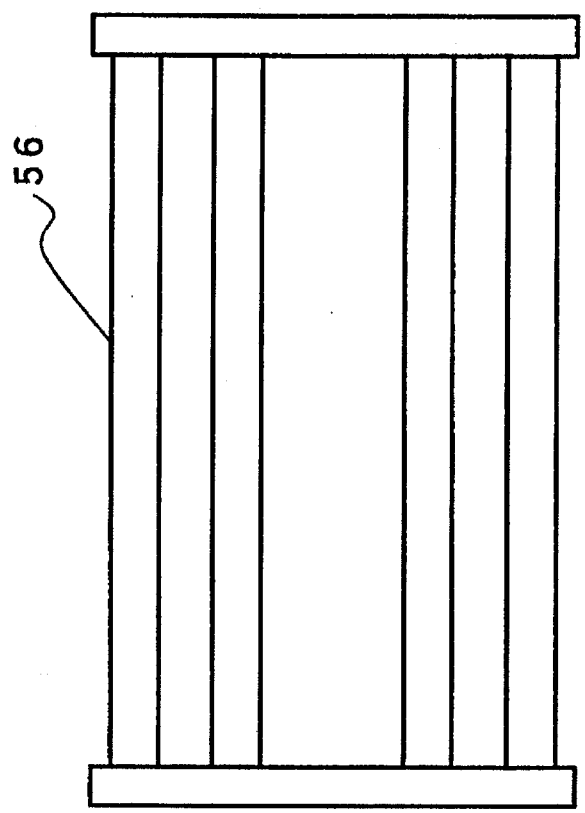
FIGS. 2A and 2B are diagrams showing an electrostatic orientation aligner shown in FIG. 1.
Figure 2A:
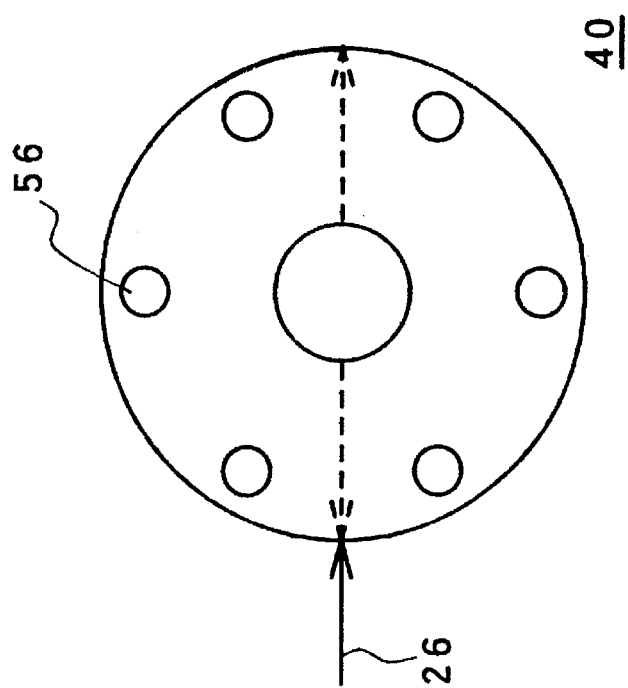

A chopper 36 is provided in the beam gun 30 on the molecule beam path and controlled by the controller 10. By this chopper 36 the molecule beam is pulsed. Thus, the amount of group V element hydride molecules can be easily obtained. However, the chopper 36 may be omitted. The chopped molecule beam is supplied to a collimator 38 by which scattered molecules are not supplied to a substrate 60 (to be described later in detail). The molecular beam through the collimator 38 is supplied to a multi-pole orientation aligner (an electric field generating section) 40 which is controlled by the controller 10. The generating section 40 includes 6 poles and generates an electrostatic electric field which is to be applied to the group V element hydride molecules. Because each of the group V element hydride molecules has a dipole, the molecule is polarized such that a lone electron pair turns to the molecule beam direction, i.e., toward the substrate 60. In other words, the generating section 40 aligns the orientation of group V element hydride molecules. The generating section 40 is shown in FIGS. 2A and 2B. The two rings are made of insulator and the 6 rods are made of metal.

The tip portion of the beam gun 30 is inserted in the reaction chamber 5 and a mechanical shutter 42 is provided at the tip portion of the beam gun 30. The open or close position of the shutter 42 is controlled by the controller 10. A driver 44 is also provided at the tip portion for changing the direction of a nozzle 46 under control by the controller 10. The driver 44 may omitted in a case that the nozzle 46 is fixed. When the shutter 42 is opened, the molecular beam with the aligned orientation is supplied toward the substrate 60 in the reaction chamber 5.

The molecular beam gun 30 has two openings 52 and 54 in this embodiment and the inside of the beam gun 30 is evacuated through the openings 52 and 54 to a predetermined pressure. The molecules scattered by the chopper 36 and reflected from the collimator 38 are exhausted from the opening 52 and the molecules supplied when the shutter 42 is closed are exhausted from the opening 54. Thus, the molecular beam of the steady state can be supplied.

The reaction chamber 5 is provided with a heater 68 and it is heated to about 700 K. or below by a driver 62. The temperature of the reaction chamber 5 is detected by a detector 64 and informed to the controller 10. The controller 10 controls the driver 62 based on the detecting result. The reaction chamber 5 is evacuated through an opening 6 to an ultra high vacuum. The substrate 60 is provided in the chamber 5 and the temperature of the substrate 60 is detected by a detector 66 and informed to the controller 10. The controller 10 may control the driver 62 based on the detecting result of the detector 66 as well as the detecting result of the detector 64. The group III element halide molecules are adsorbed on the surface of the substrate 60 in advance.

The controller controls a driving mechanism 70 which includes an x-axis direction (parallel to the surface of the figure) driver 72 for moving the substrate 60 in the x-axis direction, a y-axis direction (perpendicular to the surface of the figure) driver 74 for moving the substrate 60 in the y-axis direction and a driver 76 for rotating or turning the substrate 60.

Next, the operation of the molecular beam epitaxy apparatus according to the embodiment of the present invention will be described below.

First, the reaction chamber 5 and the beam gun 30 are evacuated. There is provided in the chamber 5 the substrate 60, on the surface of which GaCl molecules are adsorbed as the group III element halide molecules. The GaCl molecules are supplied through diffusion as usual. The reaction chamber 5 is evacuated to an ultra high vacuum and heated to about 700 K. or below by the controller 10 through the driver 62 based on the detected temperatures by the detectors 64 and 66. Subsequently, the substrate 60 and the nozzle 46 of the molecular beam gun 30 are moved to have a predetermined position relation. It is desirable that the nozzle 46 is set to be parallel to the substrate 60 surface or to be positioned above the substrate 60 a little bit. The substrate 60 and the nozzle 46 are driven by the drivers 72 to 76 and 44 under the control by the controller 10 to such a position relation and in such a manner that the nozzle 46 goes forward as possible as close to the substrate 60.

Next, $AsH_3$ gas is supplied with a predetermined constant pressure and a predetermined flow rate from the cylinder 12 as the reactant system into the molecular gun 30. The pressure and the flow rate are determined based on the expected number of collisions between the $AsH_3$ molecules. The $AsH_3$ gas is then injected in a form of molecular beam in a first cavity portion of the molecular gun 30 including the chopper 36 and the collimator 38. The $AsH_3$ molecules in the molecular beam are irradiated with an infrared beam having a frequency of 2140 or 2150 cm$^{-1}$ from an infrared light source 22. As a result, the molecular beam is excited in the vibration energy. The excited molecular beam is chopped by the chopper 36 and collimated by the collimator 38. Then the molecular beam enters the second cavity portion of the molecular beam gun 30.

The $AsH_3$ molecular beam passes through the hexapole electric field generated by the electric field generating section 40 to align the orientation of the molecules such that the lone electron pair in each molecule is turned toward the substrate, or to the molecular beam direction. Thereafter, the $AsH_3$ molecules are supplied through the shutter 42 and the nozzle 46 to the substrate 60 on which GaCl molecules are adsorbed. When As atom directly combines with Ga atom, one of the three hydrogen atoms combines with the halogen atom of the GaCl molecule to desorb from the substrate in a form of HCl. Also, the two remained hydrogen atoms of the $AsH_3$ molecule combine with each other to desorb from the substrate in a form of $H_2$. As a result, the direct combination of As and Ga is completed.

In the report by Gruter et al. the temperature of 1000 K. is required. According to the present invention, however, even in a case of the temperature of about 700 K. or below the growth rate can be obtained of a few hundreds of times to a few thousands of times compared to the conventional method in which Cl reduction by $H_2$ in the ambient is performed and the As cluster ($As_2$, $As_4$) combines with a surface Ga atom. In addition, the film thus obtained has less defects and good quality.

Next, the principle of the present invention will be described.

As shown in FIG. 3, in the interaction between the As atom and the Ga atom, the reaction system has on the way an intermediate stable state whose the energy level is lower by $\Delta E^-$ than the potential level of the reactant system. After the intermediate stable state, there is a transition state whose energy level is higher by $\Delta E^+$ than the reactant system energy level. The transition state serves as an activation barrier. The direct combining reaction of As and Ga is an endothermic process and the endothermic amount is expressed as $\Delta Q$.

When the kinetic energy of an $AsH_3$ molecule as the group V element hydride molecule incoming from the reactant system is smaller than the endothermic amount $\Delta Q$ of the production system, the $AsH_3$ molecule is reflected to be returned to the reactant system or trapped in the intermediate stable state. When the $AsH_3$ molecule is trapped into the intermediate stable state, the energy ($\Delta E^- + \Delta E^+$) is necessary for the direct combination of As and Ga as the activation barrier energy.

On the other hand, when the $AsH_3$ molecule has the kinetic energy more than $\Delta Q$, the $AsH_3$ molecule is not trapped in the intermediate stable state but goes toward the transition state. At this time, the activation barrier energy is $\Delta E^+$ from the reactant system energy level. Further, in this case, because of the attractive potential by the intermediate stable state, the $AsH_3$ molecule could be regarded to have the energy potential more than that which the $AsH_3$ molecule has originally had. Therefore, the $AsH_3$ molecule can easily jump over the activation barrier energy to achieve the direct combination of the As atom and the Ga atom.

In this manner, it is effective to give the group V element hydride molecules an energy for accelerating the direct reaction of As and Ga. For this reason, in a conventional molecular beam epitaxy apparatus the reactor needs to be heated up to a high temperature as described above.

Figure 4:
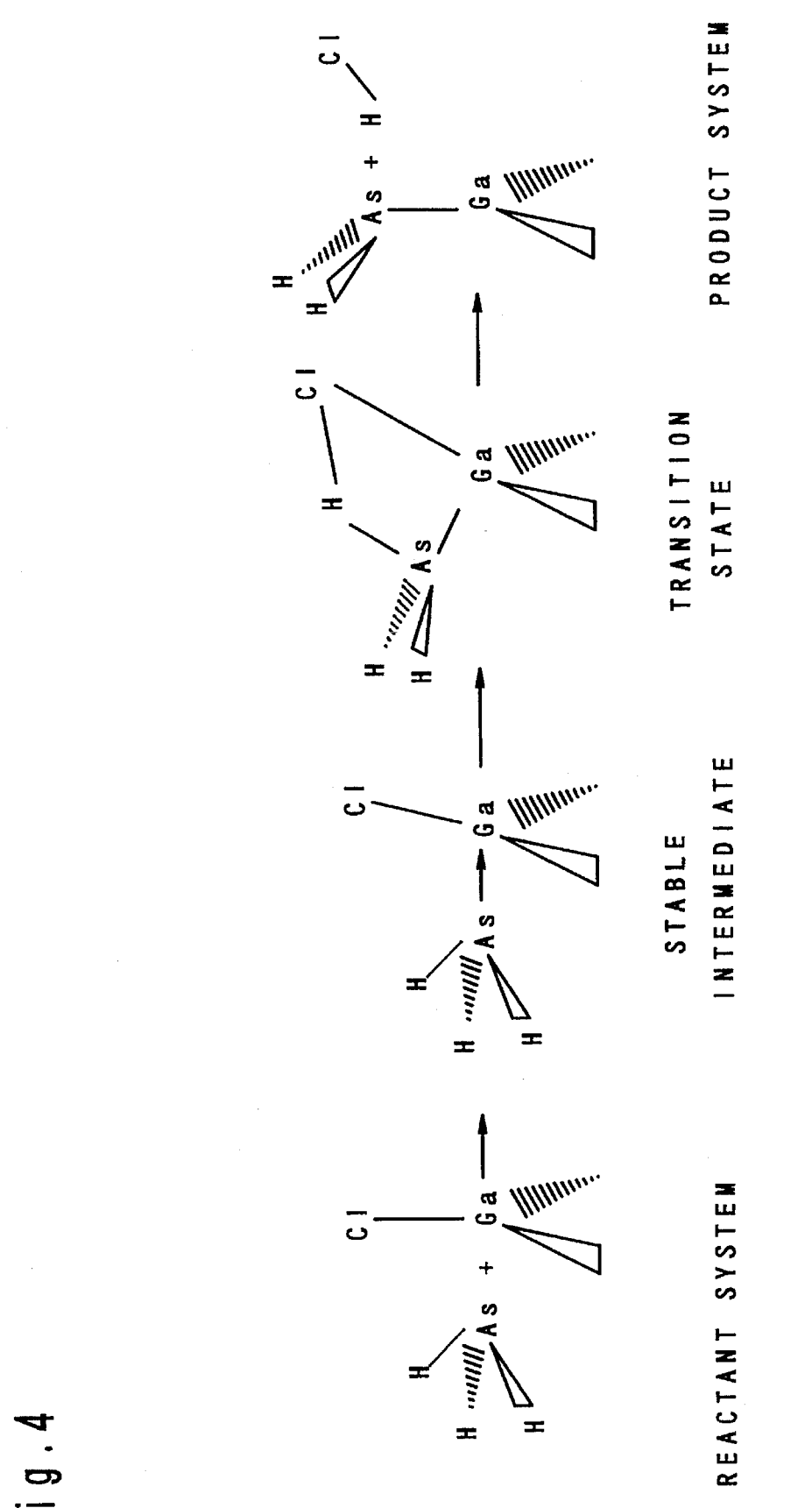
FIG. 4 is a schematic diagram showing the process of the direct combination reaction.
Figure 5:
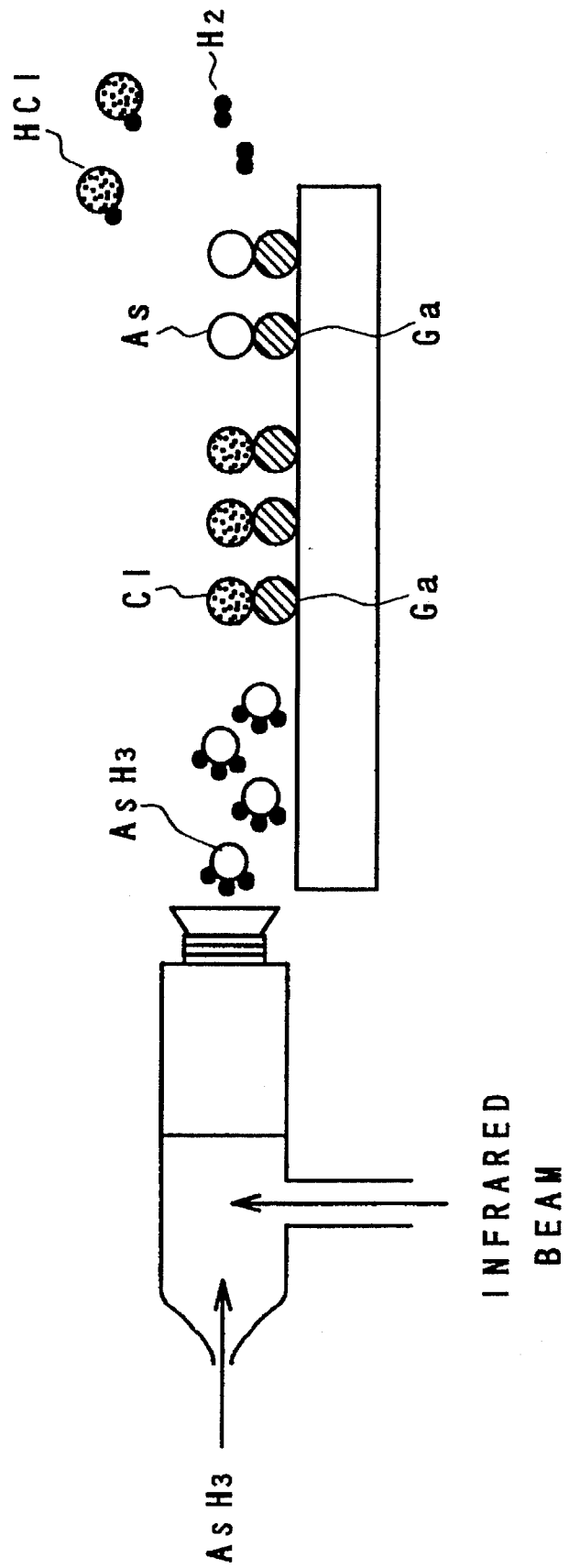
FIG. 5 is a schematic diagram showing the supply of the group V element hydride molecules to the group III element halide molecules on the surface of a substrate, the direct combination reaction of the group V atoms and the group III atoms, and the desorption of HCl molecules and $H_2$ molecules.

Next, the direct reaction process will be described. The molecular orbital calculation is non-empirically executed for $AsH_3/GaCl$ as an example. From this calculation in the direct reaction of $AsH_3$ as the group V element hydride molecule and GaCl as the group III element halide molecule on the surface of a substrate, it became apparent that delocalization of electrons was the key for starting the direct reaction, as shown in FIG. 4 That is, it is important for electrons to flow from a lone electron pair of the As atom in the $AsH_3$ molecule to an empty orbital of the Ga atom in the GaCl molecule. For this reason, both the atoms should be close to each other. If the distance between the atoms is large or the orientations do not match to each other, the direct combination reaction would not be initiated. It should be noted that the empty orbital of the group III atom has a main amplitude in the direction parallel to the substrate surface. This description and the following description can be also applied to the other sets of group V element hydride and group III element halide such as $PH_3/InCl$. In order to effectively achieve the interaction between As and Ga in a coordinate bond manner through the delocalization of electrons, the direction of the lone electron pair of As must be aligned with the empty orbital of Ga.

Next, the method of aligning the $AsH_3$ molecules as the group V element hydride molecules will be described. All the group V element hydride molecules have a dipole moment. The group V element is on the negative pole side in $NH_3$, $PH_3$ and $AsH_3$ and on the contrary it is on the positive pole side in $SbH_3$. Therefore, if the group V element hydride molecules are passed through an electric field, the group V element hydride molecules ought to be aligned so that the lone electron pairs are also aligned. In the lightest one of the group V element hydride molecules, i.e., $NH_3$, because an energy barrier is as low as 6 kcal/mol for the symmetrical inversion of an umbrella made of 3 N-H combinations ("Inorganic Chemistry", the first volume, the second edition, by Cotton Wilkinson, published from Baihuukan, (1978), p. 291), the hydrogen atom side cannot be strictly distinguished from the lone electron pair side. If there is an energy barrier of 20 Kcal/mol or more, the inversion does not occur. For instance, in $AsH_3$ which is heavier than $NH_3$, because the energy barrier is 45 kcal/mol according to the calculation on $AsH_3$ by D. Dai et al. (Journal of Chemical Physics, 93, (1990), P. 1837), the inversion does not occur. Therefore, the lone electron pair side can be distinguished from the hydrogen atom side and the orientation of the $AsH_3$ molecule can be defined. By aligning the orientation of the $AsH_3$ molecules in this manner, the possibility of direct combination of As and Ga can be increased. Also, the molecules are supplied with a predetermined pressure and a predetermined flow rate. As a result, the molecules do almost not collide with each other.

Next, the desorption process will be described. First, the kinetic energy of the group V element hydride molecule will be described. The group V element hydride molecule incoming from the reactant system has the kinetic energy with a translation energy component $E_{tra}$, a vibration energy component $E_{vib}$, and a rotation energy component $E_{rot}$. In the temperature range from a few hundreds of K. to a thousand of K., the respective energy components are expressed as follows.

$E_{tra}=(3/2)RT$ $E_{vib}=\Sigma(v_i+(1/2))hv_i$ $E_{rot}=(3/2)RT$ where R is the gas constant, T is absolute temperature, $v_i$ is the i-th quantum number of vibration, h is the Planck's constant, $v_i$ is the i-th vibration frequency, and i is taken over 6 vibration modes. As seen from the above 3 equations, the translation energy and the rotation energy depend upon the temperature of the reaction system but the vibration energy does not depend upon the temperature of the reaction system, and $v_i$ normally has energy of "0" as the lowest level.

Now, taking the direction of the $AsH_3$ molecule beam as a Z-axis direction, the translation and the rotation in the x- and y-axis directions are necessarily suppressed. The rotation about the z-axis (a lone electron pair in this case) means the rotation of 3 H atoms and therefore the influence to the reaction could be considered as it is not essential. On the other hand, the translation in the Z-axis direction means the movement of the As atom toward the Ga atom. The kinetic energy of the $AsH_3$ molecule can be primarily determined based on the flow rate of the $AsH_3$ molecule beam when the translation energy is dominant. That is, when the $AsH_3$ molecules are supplied in a form of molecular beam having sufficient energy, the temperature of the growth reactor has no relation to the direct combination reaction between the group V atom and the group III atom. Therefore, it is made possible to decrease the temperature of the growth reactor. Thus, in the present invention, the dipole moment of the group V element hydride, i.e., $AsH_3$ is used to orient $AsH_3$ with a multi-pole electric field such that the lone electron pair faces to Ga atom and such that the directions of the translation and rotation are aligned. As a result, the effect of increase of the kinetic energy of $AsH_3$ due to the attractive potential can be optimized.

The interaction of $AsH_3$ and GaCl is endothermic and the bond between the group V atom and the H atom is broken. This transition state corresponds to the late-barrier in the classification by J. C. Polanyi and W. H. Wong, (Journal of Chemical physics, 51(1969) 1439). According to the Polanyi's law, if the vibration of the bond between the group V atom and the H atom is excited as in the present invention, so that the excess vibration energy is given, the possibility that the $AsH_3$ molecules can pass through the transition state can be increased to effectively accelerate the reaction, compared to the case where the translation energy and the rotation energy are increased by raising the temperature T.

In order to hold the coherence of the molecular beam which is essential to the oriented molecular beam, in other words, in order to prevent random orientation due to the collision between the molecules, the flow rate is decreased although the density of molecules must be considered, because the flow rate can be controlled easily. As a result, the kinetic energy of the $AsH_3$ molecular beam is suppressed to a lower level. Therefore, there is employed in the present invention the energy enhancement by vibration excitation, as well as the orientation alignment. The expansion vibration movement between the As atom and the H atom can be easily excited by irradiation of infrared beam to the molecular beam. This vibration has one symmetric stretching mode and two asymmetric streching modes in a double degenerate state. In a case of $AsH_3$, the frequencies are 2140 $cm^{-1}$ and 2150 $cm^{-1}$ according to the experimental values by R. T. Arlinghaus and L. Andrews (Journal of Chemical Physics, 81, (1984), 4341). The excess energy given through the excitation is converted into the translation energy for breaking the bond between the As atom and the H atom which finally combines with a halogen atom in the course of direct combination reaction. Therefore, the possibility of completion of the reaction can be increased.

In the above embodiment, because the pressure of the molecular beam is not so high, adiabatic expansion when the $AsH_3$ molecules are injected in the beam gun 30 does not cause any problem. However, if the adiabatic expansion cause a problem, the excitation process by the infrared beam may be located after the orientation aligning process. Or the excitation process may be performed during the orientation aligning process by irradiating the infrared beam, as shown in FIG. 2A.

Next, another embodiment of the present invention will be described. In the above embodiment, the GaCl molecules are adsorbed on the surface of the substrate. However, in this embodiment, the GaCl molecules are also supplied by another molecular beam gun 100 as shown in FIG. 1. In this manner, the apparatus may include a plurality of molecular beam guns for respective different elements. The beam gun 100 has the same structure as the gun 30. The GaCl is not easily influenced through the excitation of the vibration energy. Therefore, the strict control of the wavelength of the infrared beam is not required. Thus, the infrared beam having the wavelength of about 365 $cm^{-1}$ is used and then the molecule orientation aligning process is performed because the GaCl molecule also has a lone electron pair and can be polarized.

In this manner, two beam gun 100 is first used to form the GaCl molecule surface on the substrate 60 and then after the GaCl molecular beam is stopped by the shutter 42, the $AsH_3$ molecular beam is supplied to the substrate 60 surface. As a result, the direct combination reaction is performed the single layer of GaAs can be obtained.

In this manner, in the reaction of the group V atoms on the substrate surface with the group III element halide molecules such as GaCl and InCl, a lone electron pair localized in the group III atom plays an important role. The reaction is an exothermic reaction having an early-barrier (see Physical Review B., by Mochizuki, Takada and Usui, 47, (1993), 13420). The group III element halide molecule also has a dipole moment and can be polarized by an electric field using it. If the lone electron pair in the group III atom is turned to the beam supply direction, the reaction proceeds. Therefore, if $AsH_3$ molecular beam and GaCl molecular beam are both controlled to be vibrationally excited and aligned, and the molecular beams are supplied with a predetermined angle with respect to the substrate surface, e.g., about 90° for GaCl, and a predetermined distance, it is possible to grow the GaAs epitaxial crystal on only a specific one among the surface planes, e.g., it can be grown on only a bottom surface of a groove structure and cannot be grown on the side walls.

Next, the switching control of the growth will be described. If the group V element hydride molecules are aligned such that the lone electron pair turns to the direction opposing to the molecular beam direction, the active portion of the group V element hydride molecule is hidden for the group III element halide so that the growth can be remarkably suppressed. If the group III element halide molecules are inversely orientation-aligned as described above such that the halogen atom is turned toward the substrate, the growth is suppressed. If the flow rate is selected appropriately, etching can be performed.

What is claimed is:

1. A method of controlling epitaxial growth of a group III–V compound semiconductor crystal, comprising the steps of:

providing a substrate on which group III element halide molecules are adsorbed;

supplying a beam of group V element hydride molecules toward said substrate for reaction of the group V element hydride and the group III element halide;

exciting a vibration of the group V element hydride molecules in the beam; and aligning orientation of the group V element hydride molecules in the beam.

2. The method according to claim 1, wherein said exciting step includes exciting a stretching vibration the group V element hydride molecules with an infrared light having a wavelength component corresponding to said stretching vibration.

3. The method according to claim 1, wherein said aligning step includes aligning orientation of the group V element hydride molecules such that lone electron pairs of the group V element hydride molecules are turned in a direction of said substrate.

4. The method according to claim 1, wherein said aligning step includes aligning orientation of the group V element hydride molecules such that lone electron pairs of the group V element hydride molecules are turned in a direction opposing to a direction of said substrate.

5. The method according to claim 1, wherein said supplying step includes supplying the beam of the group V element hydride molecules such that collision between said molecules in said beam is suppressed.

6. The method according to claim 1, wherein said aligning step includes aligning the orientation of the group V element hydride molecules with an electric field.

7. The method according to claim 6, wherein said electric field is a multi-polar electric field.

8. The method according to claim 1, further comprising the step of controlling a direction of the supply of the beam in accordance with a maximum amplitude location of an empty orbital of the group III atom on said substrate.

9. A method of epitaxially growing a group III–V compound semiconductor crystal, comprising the steps of:

supplying to a substrate a first beam of group III element halide molecules having lone electron pairs turned into a first direction;

supplying to said substrate a second beam of group V element hydride molecules having lone electron pairs turned into said first direction; and alternatively performing said two supplying steps, wherein said supplying a second beam includes exciting a stretching vibration of the group V element hydride molecules in said second beam.

10. The method according to claim 9, wherein said exciting step includes exciting a stretching vibration of the group V element hydride molecules with an infrared light having a wavelength component corresponding to said Stretching vibration.

11. A method of reacting group V element hydride with group III element halide, comprising the steps of:

providing a substrate on which group III element halide molecules are adsorbed;

supplying a beam of group V element hydride molecules toward said substrate;

exciting group V element hydride molecules in the beam with infrared light; and flowing said beam to direct lone electron pairs of the group V element hydride molecules into empty states of one of the group III element halide molecules to make a group V atom combine with a group III atom.

12. The method according to claim 11, wherein said exciting step includes exciting a stretching vibration of the group V element hydride molecules with the infrared light having a wavelength component corresponding to said stretching vibration.

13. The method according to claim 11, further comprising applying an electric field to said beam of group V element hydride molecules such that the lone electron pairs turns toward said substrate.

14. The method according to claim 11, further comprising the step of controlling a direction of the supply of the beam in accordance with a maximum amplitude location of an empty orbital of the group III atom on said substrate.

* * * * *